US010297598B2

(12) United States Patent
Bao et al.

(10) Patent No.: US 10,297,598 B2
(45) Date of Patent: May 21, 2019

(54) FORMATION OF FULL METAL GATE TO SUPPRESS INTERFICIAL LAYER GROWTH

(71) Applicant: International Business Machines Corporation, Armonk, NY (US)

(72) Inventors: Ruqiang Bao, Wappingers Falls, NY (US); Hemanth Jagannathan, Niskayuna, NY (US); Paul Jamison, Hopewell Junction, NY (US); Choonghyun Lee, Rensselaer, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/406,985

(22) Filed: Jan. 16, 2017

(65) Prior Publication Data
US 2018/0204839 A1    Jul. 19, 2018

(51) Int. Cl.
*H01L 29/76* (2006.01)
*H01L 27/092* (2006.01)
(Continued)

(52) U.S. Cl.
CPC .. *H01L 27/0924* (2013.01); *H01L 21/823431* (2013.01); *H01L 21/823437* (2013.01);
(Continued)

(58) Field of Classification Search
CPC ......... H01L 27/0924; H01L 21/823437; H01L 29/4958; H01L 21/823431; H01L 29/511
See application file for complete search history.

(56) References Cited

U.S. PATENT DOCUMENTS 7,598,545 B2  10/2009  Cartier et al.
8,802,527 B1   8/2014  Frank et al.
(Continued)

OTHER PUBLICATIONS

D. Yakimets et al., "Vertical GAAFETs for the ultimate CMOS scaling," IEEE Transactions on Electron Devices, vol. 62, No. 5, 2015, pp. 1433-1439.
(Continued)

*Primary Examiner* — Theresa T Doan
(74) *Attorney, Agent, or Firm* — Cantor Colburn LLP; Vazken Alexanian

(57) ABSTRACT

A semiconductor device is provided and has an n-channel field effect transistor (nFET) bottom junction and a p-channel field effect transistor (pFET) bottom junction. The semiconductor device includes first and second fin formations operably disposed in the nFET and pFET bottom junctions, respectively. The semiconductor device can also include an nFET metal gate layer deposited for oxygen absorption onto a high-k dielectric layer provided about the first fin formation in the nFET bottom junction and onto a pFET metal gate layer provided about the second fin formation in the pFET bottom junction. Alternatively, the semiconductor device can include an oxygen scavenging layer deposited onto the pFET metal gate layer about the second fin formation in the pFET bottom junction and, with the pFET metal gate layer deposited onto the nFET metal gate layer about the first fin formation in the nFET bottom junction, onto the pFET metal gate layer in the nFET bottom junction.

7 Claims, 4 Drawing Sheets

(51) Int. Cl.
*H01L 21/8234* (2006.01)
*H01L 29/66* (2006.01)
*H01L 29/78* (2006.01)
*H01L 29/49* (2006.01)
*H01L 29/51* (2006.01)

(52) U.S. Cl.
CPC .... *H01L 29/66666* (2013.01); *H01L 29/7827* (2013.01); *H01L 29/4958* (2013.01); *H01L 29/4966* (2013.01); *H01L 29/517* (2013.01)

(56) References Cited

U.S. PATENT DOCUMENTS

| | | |
|---|---|---|
| 8,912,061 B2 | 12/2014 | Frank |
| 9,299,835 B1 | 3/2016 | Anderson et al. |
| 9,431,305 B1 | 8/2016 | Anderson et al. |
| 9,824,936 B2* | 11/2017 | Machkaoutsan ...... H01L 21/321 |
| 2014/0124876 A1 | 5/2014 | Kim et al. |
| 2014/0239407 A1 | 8/2014 | Manabe et al. |
| 2015/0194423 A1* | 7/2015 | Wang .................... H01L 27/088 257/329 |
| 2015/0262828 A1 | 9/2015 | Brand et al. |
| 2017/0221889 A1* | 8/2017 | Dasgupta ............ H01L 27/0826 |

OTHER PUBLICATIONS

M. M. Frank, "High-k/metal gate innovations enabling continued CMOS scaling," Proceedings of the ESSCIRC, Sep. 12-16, 2011, pp. 50-58.

T. Ando et al., "Ultimate EOT Scaling (< 5Å) Using Hf-Based High-k Gate Dielectrics and Impact on Carrier Mobility," ECS Trans., vol. 28, No. 1. 2010, pp. 115-123.

* cited by examiner

US 10,297,598 B2

FORMATION OF FULL METAL GATE TO SUPPRESS INTERFICIAL LAYER GROWTH

BACKGROUND

The present invention relates to semiconductor devices and, more specifically, to semiconductor device fabrication techniques that include formation of a full metal gate to suppress interfacial layer growth for vertical transistors.

In vertical transistors, a key issue arising out of the effort to reduce scale and increase performance is the higher thermal budget that exists in semiconductor devices after gate formation. This higher thermal budget is due to effects of top source/drain (S/D) epitaxial growth, junction anneal operations, top spacer deposition and encapsulation deposition as compared to processes characterized by the replacements of metal gate layers. A consequence of the higher thermal budget is that interfacial layer (IL) regrowth occurs. Such IL regrowth leads to inversion thickness (Tinv) scaling becoming very challenging and, as a result, the performance of semiconductor devices can be negatively affected.

SUMMARY

According to a non-limiting embodiment of the present invention, a semiconductor device is provided and has an n-channel field effect transistor (nFET) bottom junction and a p-channel field effect transistor (pFET) bottom junction. The semiconductor device includes first and second fin formations operably disposed in the nFET and pFET bottom junctions, respectively. The semiconductor device can also include an nFET metal gate layer deposited for oxygen absorption onto a high-k dielectric layer provided about the first fin formation in the nFET bottom junction and onto a pFET metal gate layer provided about the second fin formation in the pFET bottom junction. Alternatively, the semiconductor device can include an oxygen scavenging layer deposited onto the pFET metal gate layer about the second fin formation in the pFET bottom junction and, with the pFET metal gate layer deposited onto the nFET metal gate layer about the first fin formation in the nFET bottom junction, onto the pFET metal gate layer in the nFET bottom junction.

According to another non-limiting embodiment, a method of fabricating a semiconductor device having an n-channel field effect transistor (nFET) bottom junction and a p-channel field effect transistor (pFET) bottom junction is provided. The method includes forming first and second fin formations in the nFET and pFET bottom junctions, respectively, depositing an nFET metal gate layer for oxygen absorption onto a high-k dielectric layer provided about the first fin formation in the nFET bottom junction, and depositing the nFET metal gate layer onto a pFET metal gate layer provided about the second fin formation in the pFET bottom junction.

According to yet another non-limiting embodiment, a method of fabricating a semiconductor device having an n-channel field effect transistor (nFET) bottom junction and a p-channel field effect transistor (pFET) bottom junction is provided. The method includes forming first and second fin formations in the nFET and pFET bottom junctions, respectively, depositing an oxygen scavenging layer onto a pFET metal gate layer about the second fin formation in the pFET bottom junction, depositing the pFET metal gate layer onto the nFET metal gate layer about the first fin formation in the nFET bottom junction, and depositing the oxygen scavenging layer onto the pFET metal gate layer in the nFET bottom junction.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-16 are provided to illustrate methods of fabricating a semiconductor device having an n-channel field effect transistor (nFET) bottom junction and a p-channel field effect transistor (pFET) bottom junction in which:

FIG. 1 is a side view of an initial structure of a semiconductor device having an nFET bottom junction and a pFET bottom junction in accordance with embodiments;

FIG. 2 is a side view of the semiconductor device of FIG. 1 with a patterned pFET metal gate layer in the pFET bottom junction in accordance with embodiments;

FIG. 3 is a side view of the semiconductor device of FIG. 2 with an nFET metal gate layer deposited on a high-k dielectric layer in the nFET bottom junction and on the patterned pFET metal gate layer in the pFET bottom junction in accordance with embodiments;

FIG. 4 is a side view of the semiconductor device of FIG. 3 with a recessed organic planarization layer (OPL) in accordance with embodiments;

FIG. 5 is a side view of the semiconductor device of FIG. 4 with a recessed high-k dielectric layer, a recessed pFET metal gate layer and a recessed nFET metal gate layer in accordance with embodiments;

FIG. 6 is a side view of the semiconductor device of FIG. 5 with an encapsulation layer and recessed oxide in accordance with embodiments;

FIG. 7 is a side view of the semiconductor device of FIG. 6 with nitride formed into spacers deposited over the recessed oxide in accordance with embodiments;

FIG. 8 is a side view of the semiconductor device of FIG. 7 with isolated gate elements in the nFET bottom junction and the pFET bottom junction in accordance with embodiments;

FIG. 9 is a side view of the semiconductor device of FIG. 8 with an oxide fill and top source/drain (S/D) contact areas and opened up in the nFET bottom junction and in the pFET bottom junction in accordance with embodiments;

FIG. 10 is a side view of the semiconductor device of FIG. 9 with top source/drain (S/D) epitaxy and silicide in accordance with embodiments;

FIG. 11 is a side view of the semiconductor device of FIG. 10 with bottom source/drain (S/D) contacts, top source/drain (S/D) contacts and gate contacts in accordance with embodiments;

FIG. 12 is a side view of an initial structure of a semiconductor device having an nFET bottom junction and a pFET bottom junction in accordance with embodiments;

FIG. 13 is a side view of the semiconductor device of FIG. 12 with an nFET metal gate layer deposited in the nFET bottom junction and in the pFET bottom junction in accordance with embodiments;

FIG. 14 is a side view of the semiconductor device of FIG. 13 with the nFET metal gate layer having been patterned such that it is only present in the nFET bottom junction in accordance with embodiments;

FIG. 15 is a side view of the semiconductor device of FIG. 14 with a pFET metal gate layer deposited onto the nFET metal gate layer in the nFET bottom junction and onto the high-k dielectric layer in the pFET bottom junction in accordance with embodiments; and FIG. 16 is a side view of the semiconductor device of FIG. 15 with an oxygen scavenging layer deposited onto the pFET metal gate layer in accordance with embodiments.

DETAILED DESCRIPTION

Figure 1:
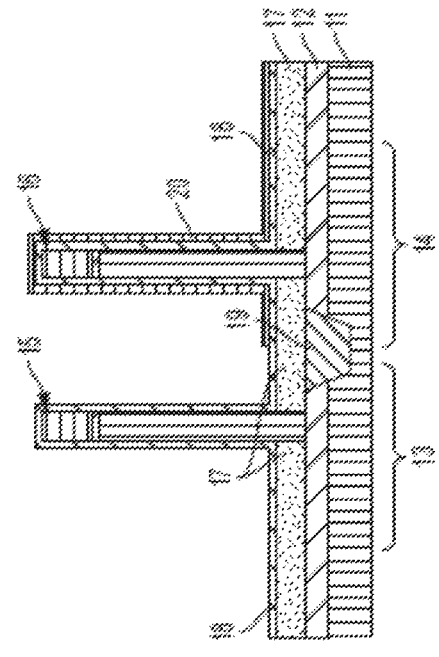

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, one or more embodiments relate to the use of an oxygen scavenging layer or stack on top of a metal gate to sink oxygen and thereby suppress interfacial layer (IL) growth or regrowth. In one case, an n-channel field effect transistor (nFET) stack is used as an nFET metal gate in an nFET bottom junction and, because the nFET stack can be a strong oxygen absorber, as a scavenging stack in the nFET bottom junction and in a p-channel field effect transistor (pFET) bottom junction. In another case, an additional scavenging stack is provided on top of both the nFET metal gate in the nFET bottom junction and the pFET metal gate in the pFET bottom junction.

Turning now to a more detailed description of embodiments of the present invention, FIG. 1 depicts an initial semiconductor device 10 according to one or more embodiments. The initial semiconductor device 10 includes a semiconductor substrate 11, a bottom junction layer 12, which can be doped with n-type dopants to define an nFET bottom junction (source or drain) 13 or p-type dopants to define a pFET bottom junction (source or drain) 14, and first and second fin formations 15, 16 extending upwardly from the bottom junction layer 12. The first fin formation 15 extends upwardly from the bottom junction layer 12 in the nFET bottom junction (source or drain) 13 and includes a semiconductor section 150, a hard mask section 151 and an oxide dielectric layer interposed between an uppermost surface of the semiconductor section 150 and a lowermost surface of the hard mask section 151. The second fin formation 16 extends upwardly from the bottom junction layer 12 in the pFET bottom junction (source or drain) 14 and includes a semiconductor section 160, a hard mask section 161 and an oxide dielectric layer interposed between an uppermost surface of the semiconductor section 160 and a lowermost surface of the hard mask section 161.

The initial semiconductor device 10 further includes bottom spacers 17, which are disposed over the bottom junction layer 12 and around lower portions of the semiconductor sections 150 and 160 of the first and second fin formations 15 and 16, and a high-k dielectric layer 18. The high-k dielectric layer 18 is deposited onto exposed surfaces of the bottom spacers 17 and onto and about the first and second fin formations 15 and 16 in the nFET bottom junction (source or drain) 13 and in the pFET bottom junction 14.

A shallow trench isolation (STI) element 19 generally provides a border between the nFET and pFET bottom junctions (source or drain) 13 and 14.

Figure 2:
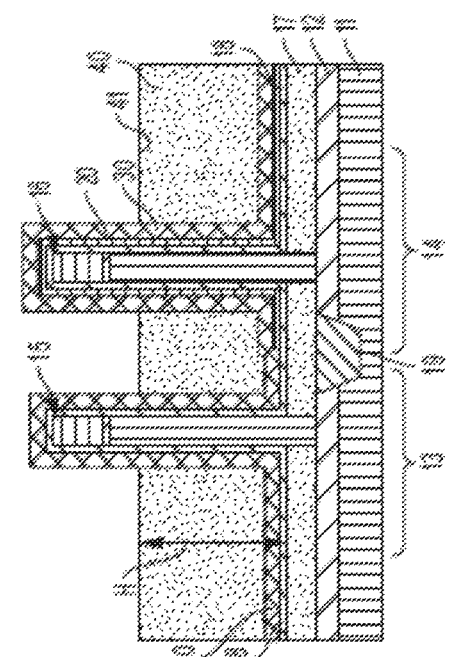

With reference to FIG. 2, a pFET work function (WF) metal gate layer 20 (hereinafter referred to as a "pFET metal gate layer 20") is deposited onto the high-k dielectric layer 18 in the nFET bottom junction (source or drain) 13 and in the pFET bottom junction (source or drain) 14 and is subsequently patterned so as to re-expose the high-k dielectric layer 18 in the nFET bottom junction (source or drain) 13. The pFET metal gate layer 20 can be provided as a single layer or as multiple layers. In either case, the pFET metal gate layer 20 can be formed of metal nitride or metal carbide such as titanium nitride (TiN), tantalum nitride (TaN), titanium carbide (TiC), tantalum carbide (TaC), or pure pFET work function metals such tungsten nitride (WN), tungsten (W), Nickle (Ni), Platinum (Pt), Cobalt, or other similar materials or combinations thereof.

Figure 3:
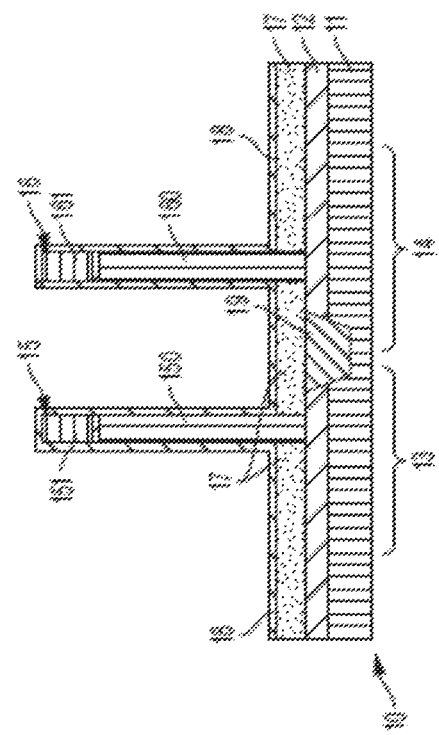

With reference to FIG. 3, an nFET work function (WF) or metal gate layer 30 (hereinafter referred to as an "nFET metal gate layer 30") is deposited onto the high-k dielectric layer 18 in the nFET bottom junction (source or drain) 13 and onto the pFET metal gate layer 20 in the pFET bottom junction 14. The nFET metal gate layer 30 can be provided as a single layer or as multiple layers. In either case, the nFET metal gate layer 30 can be formed of titanium nitride (TiN), titanium aluminum carbide (TiAlC), tantalum nitride (TaN), tantalum aluminum carbide (TaAlC), aluminum (Al), titanium aluminum (TiAl), titanium (Ti), other similar materials or combinations thereof or any materials containing metallic Al or metallic Ti. In this manner, the nFET metal gate layer 30 serves as an nFET metal gate in the nFET bottom junction (source or drain) 13 and, because the nFET metal gate layer 30 is a characteristically strong oxygen absorber, as an oxygen scavenging layer in both the nFET bottom junction (source or drain) 13 and the pFET bottom junction (source or drain) 14.

Figure 4:
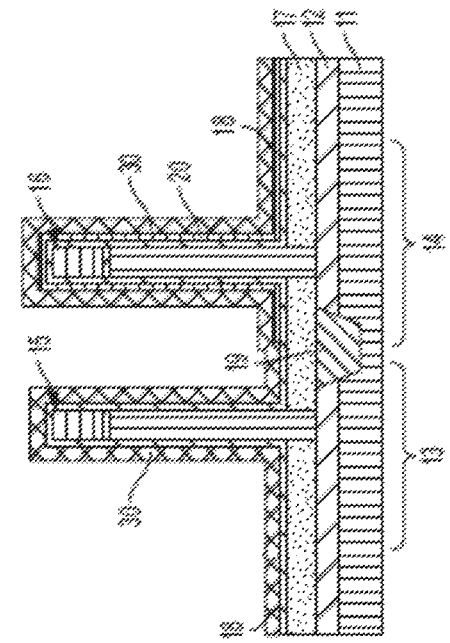

With reference to FIG. 4, an organic planarization layer (OPL) 40 is deposited onto the nFET metal gate layer 30 in the nFET bottom junction (source or drain) 13 and in the pFET bottom junction (source or drain) 14. An initial thickness of the OPL 40 is sufficient to completely cover the nFET metal gate layer 30 such that a height of the OPL 40 from an upper surface of the bottom spacers 17, for example, exceeds the combined height of the first fin formation 15, the high-k dielectric layer 18 and the nFET metal gate layer 30 in the nFET bottom junction (source or drain) 13 and exceeds to the combined height of the second fin formation 16, the high-k dielectric layer 18, the pFET metal gate layer 20 and the nFET metal gate layer 30 in the pFET bottom junction (source or drain) 14. Subsequently, as shown in FIG. 4, the OPL 40 is recessed to a height H whereby an uppermost surface 41 of the OPL 40 is lower than the uppermost surface of the semiconductor sections 150 and 160 of the first and second fin formations 15 and 16.

Figure 5:
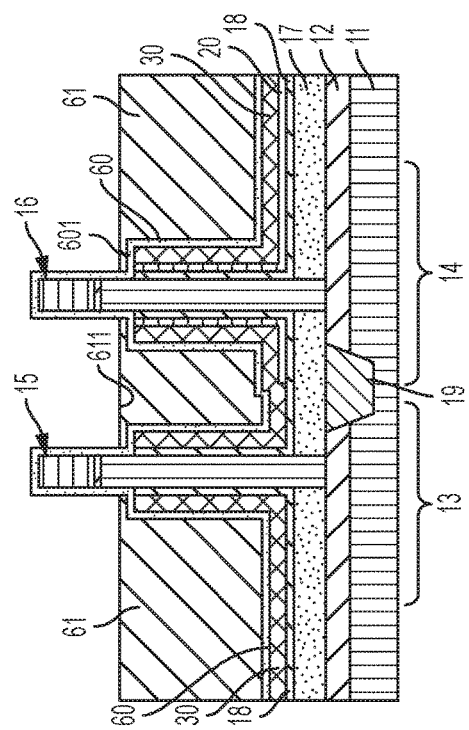

With reference to FIG. 5, the nFET metal gate layer 30 and the high-k dielectric layer 18 are recessed to the height H of the uppermost surface 41 (see FIG. 4) of the recessed OPL 40 in the nFET bottom junction (source or drain) 13 and, in a similar manner, the nFET metal gate layer 30, the pFET metal gate layer 20 and the high-k dielectric layer 18 are recessed to the height H of the uppermost surface 41 (see FIG. 4) of the recessed OPL 40 in the pFET bottom junction (source or drain) 14. Subsequently, the remaining OPL 40 is stripped to expose entireties of the nFET metal gate layer 30 in the nFET bottom junction (source or drain) 13 and in the pFET bottom junction (source or drain) 14.

Figure 6:
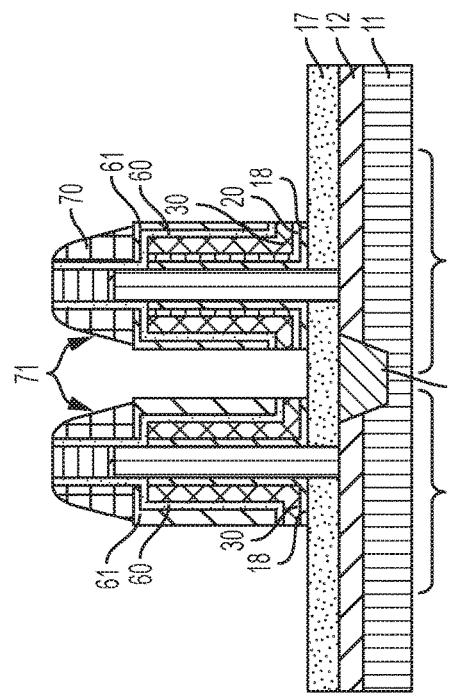

With reference to FIG. 6, following the recess of the pFET metal gate layer 20 and the nFET metal gate layer 30 and the stripping of the remaining OPL 40, an encapsulation layer 60 is deposited onto exposed surfaces of the NFET metal gate layer 30, the high-k dielectric layer 18 and the first fin formation 15 in the nFET bottom junction (source or drain) 13 and onto exposed surfaces of the pFET metal gate layer 20, the nFET metal gate layer 30, the high-k dielectric layer 18 and the second fin formation 16 in the pFET bottom junction (source or drain) 14. The encapsulation layer 60 thus forms horizontally extending flanges 601 at sidewalls of the first and second fin formations 15 and 16 where the high-k dielectric layer 18, the pFET metal gate layer 20 and the nFET metal gate layer 30 end. Subsequently, an oxide layer 61 is deposited over the encapsulation layer 60 and is recessed such that an uppermost surface 611 of the oxide layer 61 is slightly higher than the horizontally extending flanges 601

Figure 7:
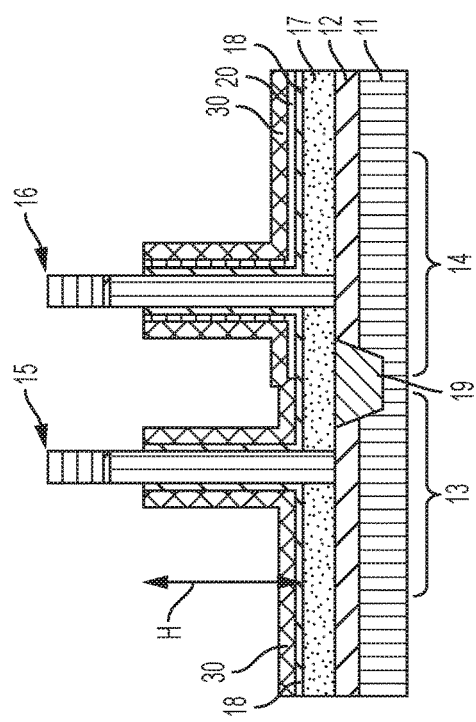

With reference to FIG. 7, a nitride layer 70 is deposited onto the uppermost surface 611 of the oxide layer 61 (see FIG. 6) and onto the portions of the encapsulation layer 60 exposed through the oxide layer 61 at the respective locations of the first fin formation 15 in the nFET bottom junction (source or drain) 13 and the second fin formation 16 in the pFET bottom junction (source or drain) 14 (see FIG. 6). The nitride layer 70 is then etched by, for example, reactive ion etching (ME), to form self-alignment gate hard masks 71 in the nFET bottom junction (source or drain) 13 and in the pFET bottom junction (source or drain) 14 and results in the formation of an intermediate structure 72.

Figure 8:
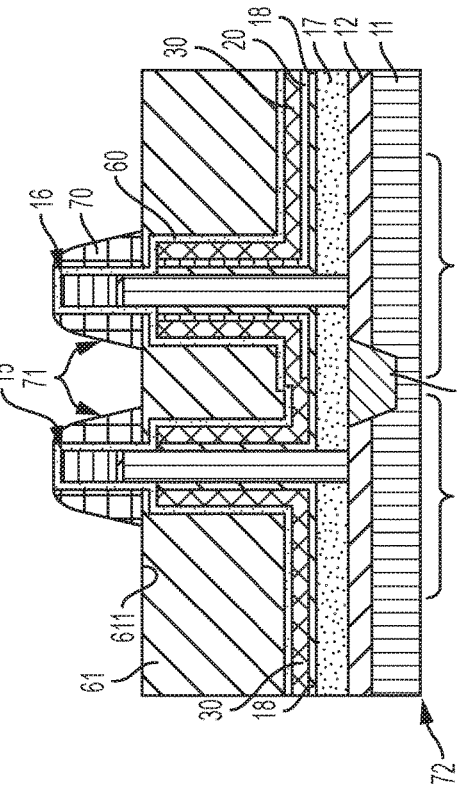

With reference to FIG. 8, an additional ME process is executed with respect to the intermediate structure 72 and results in the formation of a first isolated gate element 80 in the nFET bottom junction (source or drain) 13 and a second isolated gate element 81 in the pFET bottom junction (source or drain) 14. A width of the first isolated gate element 80 can be slightly wider than the width of the self-alignment gate hard mask 71 in the nFET bottom junction (source or drain) 13 and, in a similar manner, a width of the second isolated gate element 81 can be slightly wider than the width of the self-alignment gate hard mask 71 in the pFET bottom junction (source or drain) 14.

Figure 9:
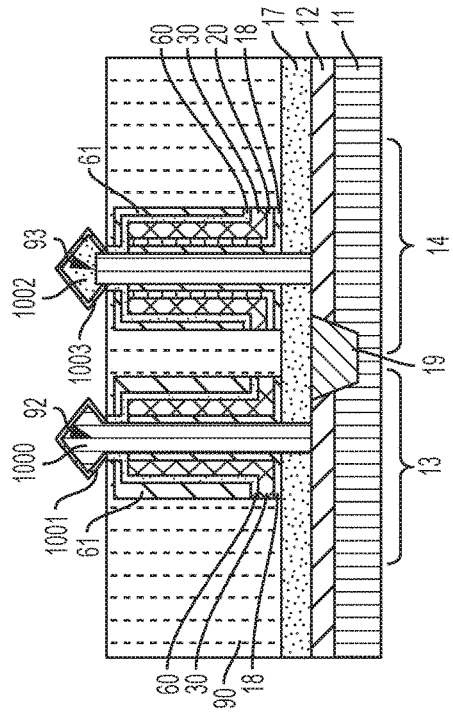

With reference to FIG. 9, an oxide fill operation is executed (optionally along with an additional encapsulation layer prior to the oxide fill) and leads to the formation of an oxide layer 90. This oxide layer 90 is then recessed by, for example, chemical mechanical polishing (CMP) or other similar processes such that an uppermost surface 901 thereof is slightly higher than the uppermost surface 611 of the oxide layer 61. In addition, non-selective RIE or wet etching processes can be executed with respect to the first and second gate elements 80 and 81 to open up top source/drain (S/D) contact areas 92 and 93 in the nFET bottom junction (source or drain) 13 and in the pFET bottom junction (source or drain) 14, respectively.

Figure 10:
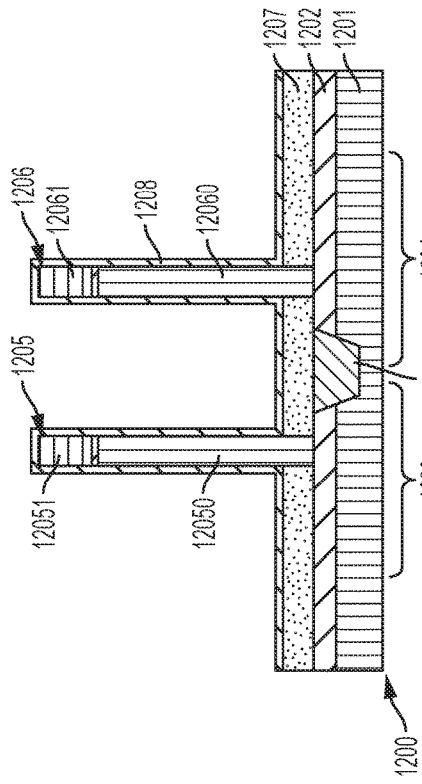

With reference to FIG. 10, top source/drain (S/D) epitaxy is executed and is followed by silicide formation. This leads to the growth of top source epitaxy 1000 and silicide 1001 in the nFET bottom junction (source or drain) 13 and to top drain epitaxy 1002 and silicide 1003 in the pFET bottom junction (source or drain) 14.

Figure 11:
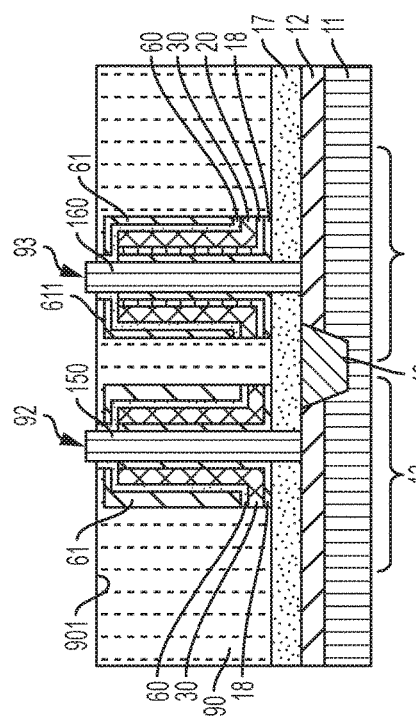

Finally, with reference to FIG. 11, additional oxide 1101 is deposited over the uppermost surface 901 (see FIG. 9) of the oxide layer 90 and conductive elements 1102 are formed into vias defined in the oxide layer 90 and the additional oxide 1101. The conductive elements 1102 thus serve as bottom source/drain (S/D) contacts, top source/drain (S/D) contacts and gate contacts.

Figure 12:
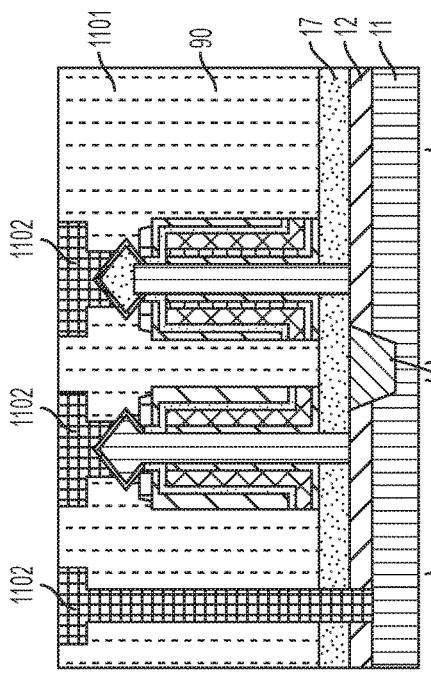

With reference to FIG. 12, an initial semiconductor device 1200 is provided. The initial semiconductor device 1200 includes a semiconductor substrate 1201, a bottom junction layer 1202, which can be doped with n-type dopants to define an nFET bottom junction (source or drain) 1203 or p-type dopants to define a pFET bottom junction (source or drain) 1204, and first and second fin formations 1205 and 1206 extending upwardly from the bottom junction layer 1202. The first fin formation 1205 extends upwardly from the bottom junction layer 1202 in the nFET bottom junction (source or drain) 1203 and includes a semiconductor section 12050, a hard mask section 12051 and a dielectric layer interposed between an uppermost surface of the semiconductor section 12050 and a lowermost surface of the hard mask section 12051. The second fin formation 1206 extends upwardly from the bottom junction layer 1202 in the pFET bottom junction (source or drain) 1204 and includes a semiconductor section 12060, a hard mask section 12061 and a dielectric layer interposed between an uppermost surface of the semiconductor section 12060 and a lowermost surface of the hard mask section 12061.

The initial semiconductor device 1200 further includes bottom spacers 1207, which are disposed over the bottom junction layer 1202 and around lower portions of the semiconductor sections 12050 and 12060 of the first and second fin formations 1205 and 1206, and a high-k dielectric layer 1208. The high-k dielectric layer 1208 is deposited onto exposed surfaces of the bottom spacers 1207 and onto and about the first and second fin formations 1205 and 1206 in the nFET bottom junction (source or drain) 1203 and in the pFET bottom junction (source or drain) 1204.

Figure 13:
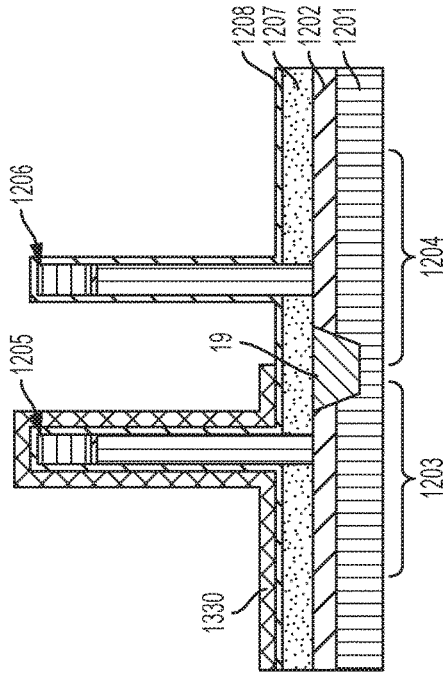

With reference to FIG. 13, an nFET metal gate layer 1330 is deposited onto the high-k dielectric layer 1208 in the nFET bottom junction (source or drain) 1203 and in the pFET bottom junction (source or drain) 1204. The nFET metal gate layer 1330 can be provided as a single layer or as multiple layers. In either case, the nFET metal gate layer 1330 can be formed titanium nitride (TiN), titanium aluminum carbide (TiAlC), tantalum nitride (TaN), tantalum aluminum carbide (TaAlC), aluminum (Al), titanium aluminum (TiAl), titanium (Ti), other similar materials or combinations thereof or any materials containing metallic Al or metallic Ti.

Figure 14:
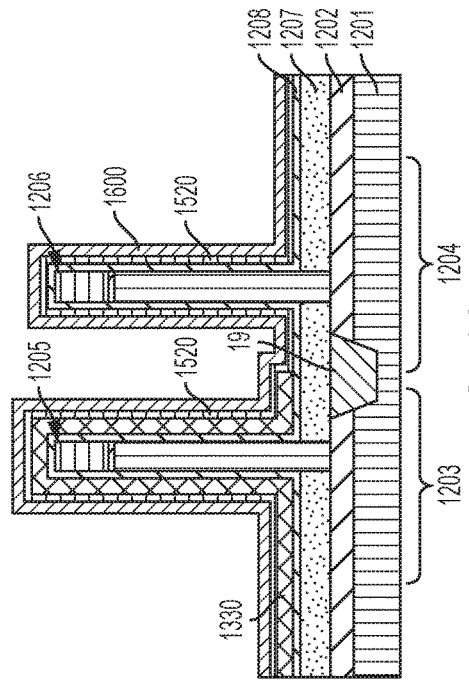

With reference to FIG. 14, the nFET metal gate layer 1330 is patterned to re-expose the high-k dielectric layer 1208 in the pFET bottom junction (source or drain) 1204.

Figure 15:
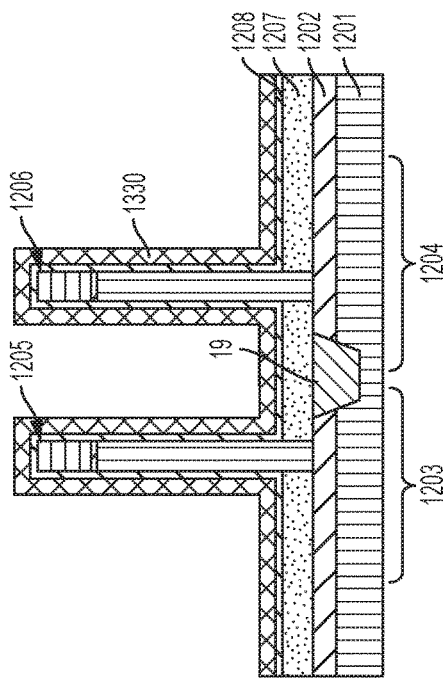

With reference to FIG. 15, a pFET metal gate layer 1520 is deposited onto the nFET metal gate layer 1330 in the nFET bottom junction (source or drain) 13 and onto the high-k dielectric layer 1208 in the pFET bottom junction (source or drain) 14. The pFET metal gate layer 1520 can be provided as a single layer or as multiple layers. In either case, the pFET metal gate layer 1520 can be formed of metal nitride or metal carbide such as titanium nitride (TiN), tantalum nitride (TaN), titanium carbide (TiC), tantalum carbide (TaC), or pure pFET work function metals such tungsten nitride (WN), tungsten (W), Nickle (Ni), Platinum (Pt), Cobalt, or other similar materials or combinations thereof.

Figure 16:

With reference to FIG. 16, an oxygen scavenging layer 1600 is deposited onto the portion of the pFET metal gate layer 1520 in the nFET bottom junction (source or drain) 13 and onto the portion of the pFET metal gate layer 1520 in the pFET bottom junction (source or drain) 14. The oxygen scavenging layer 1600 can include a single layer or multiple layers. Where the oxygen scavenging layer 1600 includes a single layer, the oxygen scavenging layer 1600 can include at least one or more of titanium aluminum carbide (TiAlC), tantalum aluminum carbide (TaAlC), titanium (Ti) and aluminum (Al). Where the oxygen scavenging layer 1600 includes multiple layers, the oxygen scavenging layer 1600 can include at least one or more of titanium aluminum carbide (TiAlC), tantalum aluminum carbide (TaAlC), titanium aluminum (TiAl), titanium (Ti) and aluminum (Al) and any materials containing metallic Al or metallic Ti or other oxygen scavenging materials.

Once the oxygen scavenging layer 1600 is completely deposited, a fully formed semiconductor device can be completed over and around the oxygen scavenging layer 1600 in a manner similar to what is shown in FIGS. 4-11.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device having an n-channel field effect transistor (nFET) bottom junction and a p-channel field effect transistor (pFET) bottom junction, the method comprising:

forming first and second fin formations in the nFET and pFET bottom junctions, respectively;

depositing an nFET metal gate layer for oxygen absorption directly onto a high-k dielectric layer provided about the first fin formation in the nFET bottom junction;

depositing the nFET metal gate layer directly onto a pFET metal gate layer provided about the second fin formation in the pFET bottom junction;

terminating the nFET metal gate layer and the high-k dielectric layer along sidewalls of the first fin formation in the nFET bottom junction;

terminating the nFET metal gate layer, the pFET metal gate layer and the high-k dielectric layer along sidewalls of the second fin formation in the pFET bottom junction; and sequentially depositing encapsulation and oxide layers such that upper portions of the first and second fin formations and corresponding sections of the encapsulation layer protrude from the oxide layer in the nFET and pFET regions;

depositing nitride about the upper portions of the first and second fin formations and corresponding sections of the encapsulation layer in the nFET and pFET regions;

etching through the oxide layer, the encapsulation layer, the nFET metal gate layer and the high-k dielectric layer in the nFET region to form an isolated gate element in the nFET region; and etching through the oxide layer, the encapsulation layer, the nFET metal gate layer, the pFET metal gate layer and the high-k dielectric layer to form an isolated gate element in the pFET region.

2. The method according to claim 1, wherein the nFET metal gate layer comprises a single layer or multiple layers.

3. The method according to claim 1, wherein the nFET metal gate layer comprises at least one or more of titanium nitride (TiN), titanium aluminum carbide (TiAlC), tantalum nitride (TaN), tantalum aluminum carbide (TaAlC), aluminum (Al), titanium aluminum (TiAl), titanium (Ti), other similar materials or combinations thereof or any materials containing metallic Al or metallic Ti and metallic nitrides or metallic carbides.

4. The method according to claim 1, wherein the pFET metal gate layer comprises a single layer or multiple layers.

5. The method according to claim 1, wherein the pFET metal gate layer comprises at least one or more of metal nitride or metal carbide including titanium nitride (TiN), tantalum nitride (TaN), tungsten nitride (WN), titanium carbide (TiC), tantalum carbide (TaC), or pure pFET work function metals including tungsten (W), Nickle (Ni), Platinum (Pt) or Cobalt or combinations thereof.

6. The method according to claim 1, wherein:

a surface of the nFET metal gate layer directly abuts a complementary surface of the high-k dielectric layer in the nFET bottom junction, and a surface of the nFET metal gate layer directly abuts a complementary surface of the pFET metal gate layer in the pFET bottom junction.

7. The method according to claim 1, wherein:

the first and second fin formations respectively comprise a semiconductor section and a hard mask section above an uppermost surface of the semiconductor section, the sidewalls of the first and second fin formations respectively extending along the respective semiconductor sections, and the terminating comprising:

a deposition of a planarization layer in the nFET and pFET bottom junctions; and a recession of the nFET metal gate layer and the high-k dielectric layer in the nFET bottom junction and the nFET metal gate layer, the pFET metal gate layer and the high-k dielectric layer in the pFET bottom junction to an uppermost surface of the planarization layer.

* * * * *